United States Patent
Kim

(10) Patent No.: US 8,283,765 B2
(45) Date of Patent: Oct. 9, 2012

(54) SEMICONDUCTOR CHIP AND STACKED SEMICONDUCTOR PACKAGE HAVING THE SAME

(75) Inventor: Jong Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 144 days.

(21) Appl. No.: 12/835,933

(22) Filed: Jul. 14, 2010

(65) Prior Publication Data

US 2011/0121433 A1 May 26, 2011

(30) Foreign Application Priority Data

Nov. 20, 2009 (KR) .................. 10-2009-0112624

(51) Int. Cl.
*H01L 23/02* (2006.01)
*H01L 23/04* (2006.01)
*H01L 23/34* (2006.01)

(52) U.S. Cl. ........ 257/685; 257/686; 257/698; 257/723; 257/724; 257/774; 257/E23.011

(58) Field of Classification Search .................. 257/685, 257/686, 698, 723, 724, 774, E23.011
See application file for complete search history.

(56) References Cited

U.S. PATENT DOCUMENTS

| | | | | |
|---|---|---|---|---|
| 4,939,568 A * | 7/1990 | Kato et al. | ..................... | 257/686 |
| 5,481,133 A * | 1/1996 | Hsu | ................. | 257/621 |
| 6,809,421 B1 * | 10/2004 | Hayasaka et al. | ............. | 257/777 |
| 6,919,632 B2 * | 7/2005 | Sei | ................. | 257/723 |
| 7,576,433 B2 * | 8/2009 | Ishino et al. | .................. | 257/777 |
| 7,829,975 B2 * | 11/2010 | Hayasaka et al. | ............. | 257/621 |
| 8,004,090 B2 * | 8/2011 | Uchiyama | ..................... | 257/774 |
| 2003/0057549 A1 * | 3/2003 | Sei | ................. | 257/723 |
| 2005/0014311 A1 * | 1/2005 | Hayasaka et al. | ............. | 438/109 |
| 2006/0220214 A1 * | 10/2006 | Ando | ............................ | 257/690 |
| 2006/0223199 A1 * | 10/2006 | Ando | ................................ | 438/3 |
| 2006/0237851 A1 * | 10/2006 | Ko et al. | ......................... | 257/774 |
| 2007/0045803 A1 * | 3/2007 | Ye et al. | ......................... | 257/686 |
| 2007/0090517 A1 * | 4/2007 | Moon et al. | ..................... | 257/706 |
| 2007/0181991 A1 * | 8/2007 | Ishino et al. | .................. | 257/686 |
| 2007/0182017 A1 * | 8/2007 | Park | .............................. | 257/774 |
| 2007/0222050 A1 * | 9/2007 | Lee et al. | ......................... | 257/678 |
| 2008/0142928 A1 * | 6/2008 | Sitaram et al. | ................. | 257/621 |
| 2008/0237888 A1 * | 10/2008 | Hayasaka et al. | ............. | 257/777 |
| 2009/0108464 A1 * | 4/2009 | Uchiyama | ..................... | 257/774 |
| 2010/0001397 A1 * | 1/2010 | Kirisawa | ........................ | 257/723 |
| 2010/0007014 A1 * | 1/2010 | Suzuki et al. | .................. | 257/723 |
| 2010/0032762 A1 * | 2/2010 | Park et al. | ...................... | 257/350 |

(Continued)

FOREIGN PATENT DOCUMENTS

JP 2006-032380 A 2/2006

(Continued)

*Primary Examiner* — Ngan Ngo
(74) *Attorney, Agent, or Firm* — Ladas & Parry LLP

(57) ABSTRACT

A semiconductor chip and a stacked semiconductor package are presented. The semiconductor chip includes a semiconductor substrate, circuit patterns, first input/output pads and second input/output pads. The semiconductor substrate is divided into cell and peripheral regions and has first and second surfaces which oppose each other. The circuit patterns are formed on the first surface of the semiconductor substrate and are connected with the cell region and the peripheral region. The first input/output pads are formed in the cell region and are connected to the circuit patterns. The second input/output pads are formed in the peripheral region and connected with the circuit patterns.

11 Claims, 10 Drawing Sheets

U.S. PATENT DOCUMENTS

| | | | |
|---|---|---|---|
| 2010/0052182 A1* | 3/2010 | Koyama | 257/773 |
| 2010/0109164 A1* | 5/2010 | Kang et al. | 257/774 |
| 2011/0057315 A1* | 3/2011 | Fang et al. | 257/750 |
| 2011/0133343 A1* | 6/2011 | Wada | 257/774 |
| 2011/0156232 A1* | 6/2011 | Youn et al. | 257/686 |
| 2012/0025379 A1* | 2/2012 | Moore et al. | 257/750 |

FOREIGN PATENT DOCUMENTS

| | | |
|---|---|---|
| KR | 1020000062884 A | 10/2000 |
| KR | 1020030006915 A | 1/2003 |
| KR | 10-0605315 A | 7/2006 |

* cited by examiner

SEMICONDUCTOR CHIP AND STACKED SEMICONDUCTOR PACKAGE HAVING THE SAME

CROSS-REFERENCE TO RELATED APPLICATIONS

The present application claims priority to Korean patent application number 10-2009-112624 filed on Nov. 20, 2009, which is incorporated herein by reference in its entirety.

BACKGROUND OF THE INVENTION

The present invention relates to a semiconductor chip and a stacked semiconductor package having the same.

In general, a semiconductor chip has a cell region in which integrated circuits are formed and a peripheral region which is defined outside the cell region and in which input/output pads for controlling input/output of data are formed, depending upon a chip design. The input/output pads which are formed in the peripheral region are electrically connected with input/output circuits and form electrical contacts with an outside.

In the case of semiconductor chips which have through electrodes, since input/output pads for connecting the through electrodes of an upper semiconductor chip and the through electrodes of a lower semiconductor chip are added, the semiconductor chips should have peripheral regions which have increased sizes so that the sizes of the semiconductor chips increase. One problem is that if the size of a semiconductor chip increases, the number of dies manufactured per wafer decreases and as a result the manufacturing costs increase.

In order to prevent or minimize size increases in the semiconductor chips, the sizes of the input/output pads should be decreased. However, input/output pads should have basic minimum size restrictions for enabling electric die sorting test to be performed to prove the reliability of the semiconductor chip and for forming electrical interconnections. Accordingly, physical limitations exist in decreasing the sizes and the pitches of the input/output pads. As a consequence, it is difficult to decrease of the size of peripheral regions in which the input/output pads are formed because these physical limitations exist in decreasing the size of the semiconductor chip.

BRIEF SUMMARY OF THE INVENTION

Embodiments of the present invention are directed to a semiconductor chip which can overcome or at least address these limitations in decreasing a size due to the presence of input/output pads and can realize a lightweight, thin, compact and miniature resultant structure, and a stacked semiconductor package having the same.

In one embodiment of the present invention, a semiconductor chip can include: a semiconductor substrate divided into a cell region and a peripheral region and having first surface and the second surface which faces away from the first surface; circuit patterns formed over the first surface of the semiconductor substrate and connected with the cell region and the peripheral region; first input/output pads formed in the cell region and connected with the circuit patterns; and second input/output pads formed in the peripheral region and connected with the circuit patterns.

The first input/output pads may be formed to have sizes greater than those of the second input/output pads.

The semiconductor chip may further include through electrodes passing through the first surface and the second surface of the semiconductor substrate, formed in the peripheral region, and electrically connected with the second input/output pads.

The first input/output pads may be formed in the cell region over the first surface of the semiconductor substrate.

The first input/output pads may be formed in the cell region over the second surface of the semiconductor substrate.

The semiconductor chip may further include through wiring lines formed in the cell region, passing through the first surface and the second surface of the semiconductor substrate, and electrically connecting the circuit patterns and the first input/output pads.

The first input/output pads may be formed to have sizes greater than those of the second input/output pads.

In another embodiment of the present invention, a stacked semiconductor package may include: a plurality of semiconductor chips stacked upon one another, and each including a semiconductor substrate divided into a cell region and a peripheral region and having first surface and the second surface which faces away from the first surface, circuit patterns formed over the first surface of the semiconductor substrate and connected with the cell region and the peripheral region, first input/output pads formed in the cell region and connected with the circuit patterns, second input/output pads formed in the peripheral region and connected with the circuit patterns, and through electrodes passing through the first surface and the second surface of the semiconductor substrate, formed in the peripheral region, and electrically connected with the second input/output pads, wherein the plurality of semiconductor chips are stacked such that the second input/output pads of upwardly positioned semiconductor chips and the through electrodes of downwardly positioned semiconductor chips are connected.

The first input/output pads may be formed to have sizes greater than those of the second input/output pads.

The first input/output pads may be formed in the cell region over the first surface of the semiconductor substrate.

The first input/output pads may be formed in the cell region over the second surface of the semiconductor substrate.

The stacked semiconductor package may further include through wiring lines formed in the cell region, passing through the first surface and the second surface of the semiconductor substrate, and electrically connecting the circuit patterns and the first input/output pads.

The first input/output pads may be formed to have sizes greater than those of the second input/output pads.

The stacked semiconductor package may further include an insulation layer formed on the first surface of a lowermost semiconductor chip in such a way as to expose the first input/output pads of the lowermost semiconductor chip among the plurality of stacked semiconductor chips.

The stacked semiconductor package may further include external connection terminals attached to the first input/output pads of the lowermost semiconductor chip.

The stacked semiconductor package may further include a first insulation layer formed on the first surface of a lowermost semiconductor chip in such a way as to expose the first input/output pads of the lowermost semiconductor chip among the plurality of stacked semiconductor chips; redistribution lines formed on the first insulation layer and electrically connected with the first input/output pads of the lowermost semiconductor chip; and a second insulation layer formed on the first insulation layer including the redistribution lines and exposing portions of the redistribution lines.

The stacked semiconductor package may further include external connection terminals formed on the portions of the redistribution lines which are exposed through the second insulation layer.

The stacked semiconductor package may further include a substrate having the plurality of stacked semiconductor chips mounted thereon and electrically connected with the first input/output pads of the lowermost semiconductor chip among the plurality of stacked semiconductor chips.

The stacked semiconductor package may further include a substrate having the plurality of stacked semiconductor chips mounted thereon and electrically connected with the second input/output pads of the lowermost semiconductor chip among the plurality of stacked semiconductor chips.

Since input/output pads are formed not only in a peripheral region but also in a cell region in such a way as to be dispersed, the size of the peripheral region can be reduced by the area of input/output pads which are formed in the cell region. Thus, it is possible to provide a semiconductor chip which can overcome many of limitations in decreasing a size due to the presence of input/output pads and can realize a lightweight, thin, compact and miniature resultant structure, and a stacked semiconductor package having the same.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention. It is to be also understood herein that when it is claimed that any two elements are 'on' each other may be interpreted to being directly on each other, i.e., touching each other, or may have any number of intervening components in between these two elements.

Figure 1:
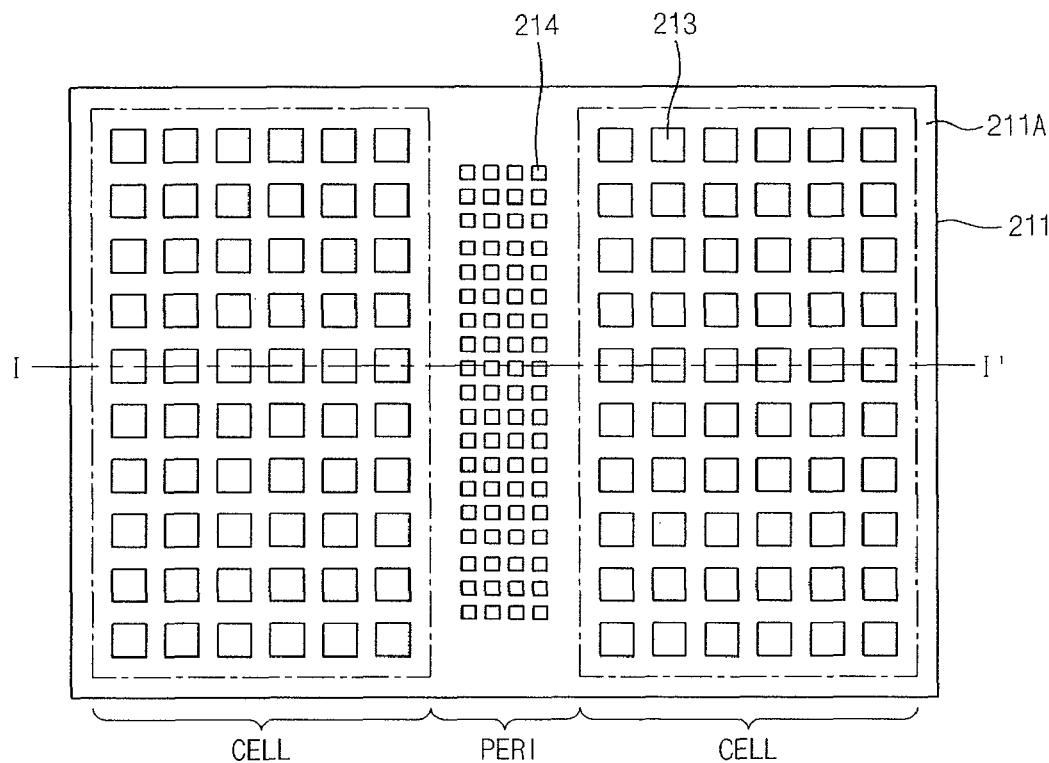
FIG. 1 is a plan view illustrating a semiconductor chip in accordance with a first embodiment of the present invention.
Figure 2:
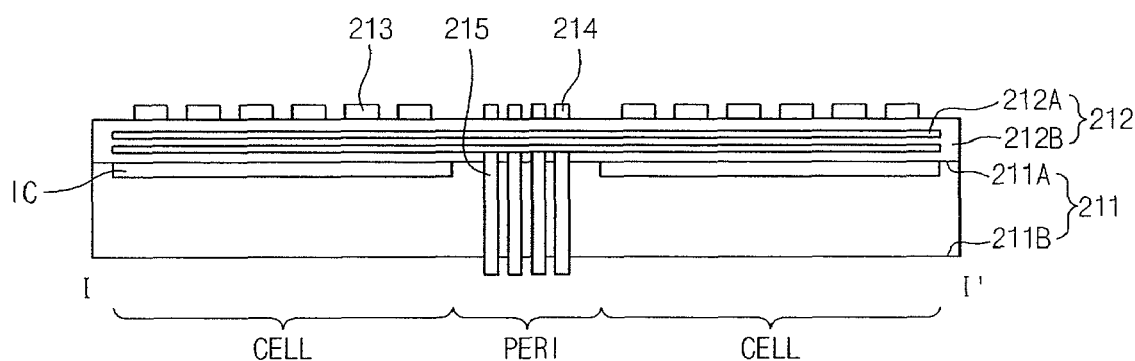
FIG. 2 is a cross-sectional view taken along the line I-I' of FIG. 1.

FIG. 1 is a plan view illustrating a semiconductor chip in accordance with a first embodiment of the present invention, and FIG. 2 is a cross-sectional view taken along the line I-I' of FIG. 1.

Referring to FIGS. 1 and 2, a semiconductor chip 200 in accordance with a first embodiment of the present invention includes a semiconductor substrate 211, circuit patterns 212, and first and second input/output pads 213 and 214. Besides, the semiconductor chip 200 further includes through electrodes 215.

The semiconductor substrate 211 is divided into a cell region CELL and a peripheral region PERI, and has first surface 211A and the second surface 211B which faces away from the first surface 211A. Integrated circuits IC which depend upon a chip design are formed in the cell region CELL over the first surface 211A of the semiconductor substrate 211, and input/output circuits are formed in the peripheral region PERI over the first surface 211A of the semiconductor substrate 211.

The circuit patterns 212 are formed over the first surface 211A of the semiconductor substrate 211 and are connected with the cell region CELL and the peripheral region PERI.

The first and second input/output pads 213 and 214 are formed over the circuit patterns 212 and are electrically connected with the circuit patterns 212. The first input/output pads 213 are formed in the cell region CELL over the first surface 211A of the semiconductor substrate 211, and the second input/output pads 214 are formed in the peripheral region PERI over the first surface 211A of the semiconductor substrate 211. In the present embodiment, the first input/output pads 213 have sizes greater than those of the second input/output pads 214.

The circuit patterns 212 include a plurality of wiring layers 212A which are formed over the first surface 211A of the semiconductor substrate 211 and electrically connect the input/output circuits of the peripheral region PERI and the first input/output pads 213 of the cell region CELL, and an insulation layer 212B which is formed over the first surface 211A of the semiconductor substrate 211 and insulates the wiring layers 212A from one another and the wiring layers 212A and the first and second input/output pads 213 and 214 from one another.

The through electrodes 215 pass through the first surface 211A and the second surface 211B of the semiconductor substrate 211. The through electrodes 215 are formed in the peripheral region PERI and are electrically connected with the second input/output pads 214.

At one end of the through electrodes 215, the through electrodes 215 are electrically connected with the second input/output pads 214 of the peripheral region PERI. At the other end of the through electrodes 215, which face away from the one ends, the through electrodes 215 project outward away from the second surface 211B of the semiconductor substrate 211.

In the present embodiment, at one end of the through electrodes 215, the through electrodes 215 may be directly connected with the circuit patterns 212 at the peripheral region PERI over the first surface 211A of the semiconductor substrate 211. As a result, the through electrodes 215 are connected with the second input/output pads 214 through the circuit patterns 212. Alternately the ends of the through electrodes 215 may be directly connected with the second input/output pads 214.

Figure 3:
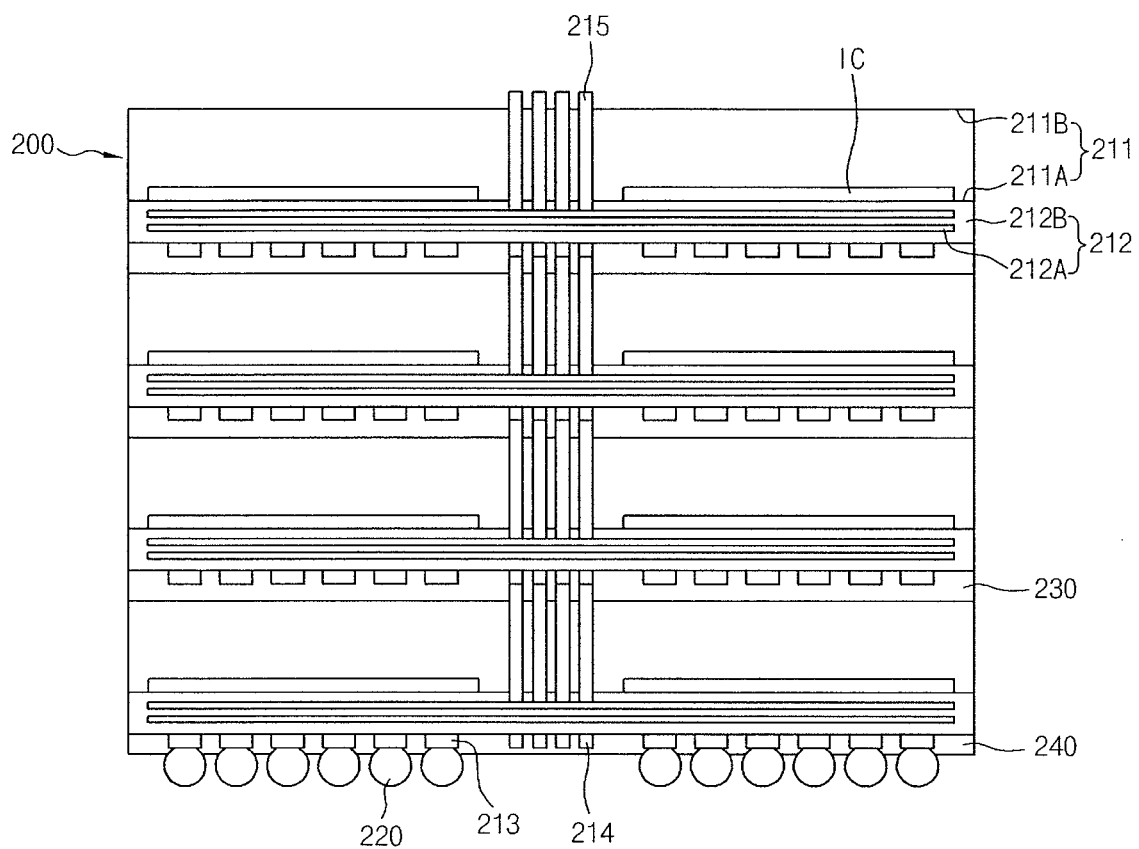
FIG. 3 is a cross-sectional view illustrating a first embodiment type of a stacked semiconductor package having the semiconductor chip in accordance with the first embodiment of the present invention.

FIG. 3 is a cross-sectional view illustrating a first embodiment type of a stacked semiconductor package having the semiconductor chip in accordance with the first embodiment of the present invention.

Referring to FIG. 3, after a plurality of semiconductor chips 200, each of which has first and second input/output pads 213 and 214 and through electrodes 215, are prepared, the through electrodes 215 of the respective semiconductor chips 200 are connected with the second input/output pads 214 of other semiconductor chips 200. In this way, the plurality of, for example, four semiconductor chips 200 are stacked. Adhesive members 230 are formed between the stacked semiconductor chips 200.

An insulation layer 240 is formed on first surface 211A of the lower most semiconductor chip 200 which is positioned lowermost among the stacked semiconductor chips 200, in such a way as to expose the first input/output pads 213 of the lowermost semiconductor chip 200. External connection terminals 220 are attached to the first input/output pads 213 of the lowermost semiconductor chip 200 which are exposed through the insulation layer 240.

Figure 4:
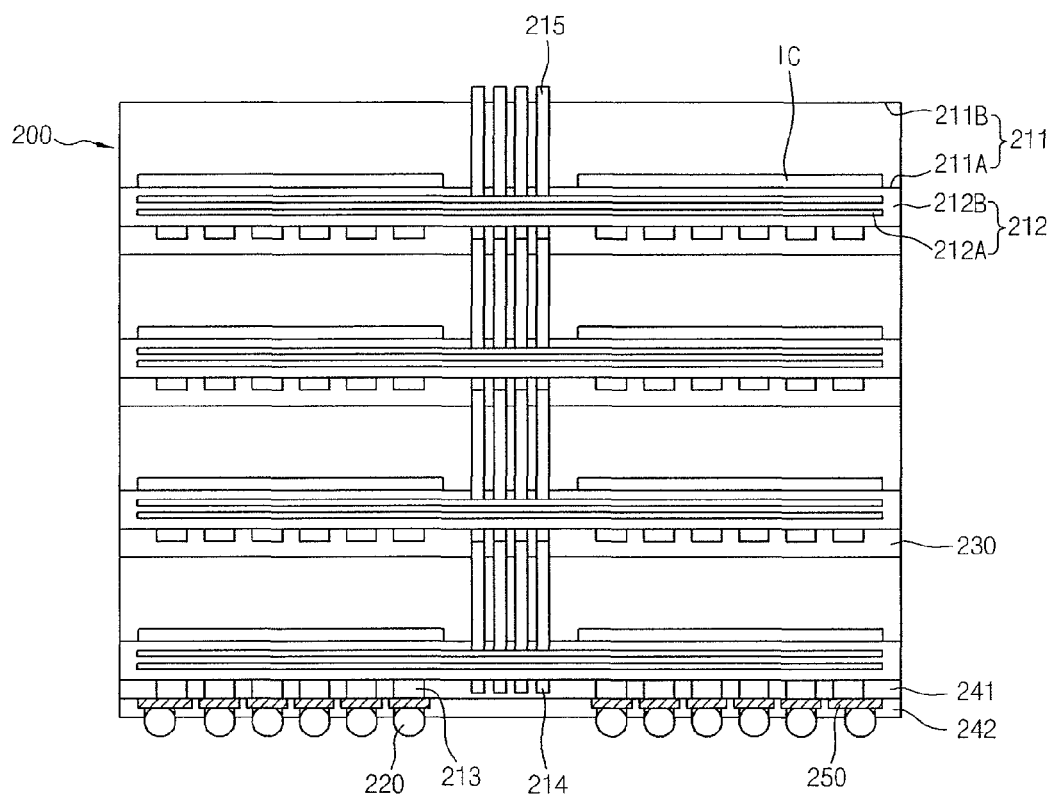
FIG. 4 is a cross-sectional view illustrating a second embodiment type of the stacked semiconductor package having the semiconductor chip in accordance with the first embodiment of the present invention.

FIG. 4 is a cross-sectional view illustrating a second embodiment type of the stacked semiconductor package having the semiconductor chip in accordance with the first embodiment of the present invention.

Referring to FIG. 4, after a plurality of semiconductor chips 200, each of which has first and second input/output pads 213 and 214 and through electrodes 215, are prepared, the through electrodes 215 of the respective semiconductor chips 200 are connected with the second input/output pads 214 of other semiconductor chips 200. In this way, the plurality of, for example, four semiconductor chips 200 are stacked. Adhesive members 230 are formed between the stacked semiconductor chips 200.

A first insulation layer 241 is formed on first surface 211 of the lower most semiconductor chip 200 which is positioned lowermost among the stacked semiconductor chips 200, in such a way as to expose the first input/output pads 213 of the lowermost semiconductor chip 200. Redistribution lines 250 are formed on the first insulation layer 241 in such a way as to be electrically connected with the first input/output pads 213 of the lowermost semiconductor chip 200, and a second insulation layer 242 is formed on the first insulation layer 241 including the redistribution lines 250 in such a way as to expose the redistribution lines 250. External connection terminals 220 are attached to the redistribution lines 250 which are exposed through the second insulation layer 242.

Figure 5:
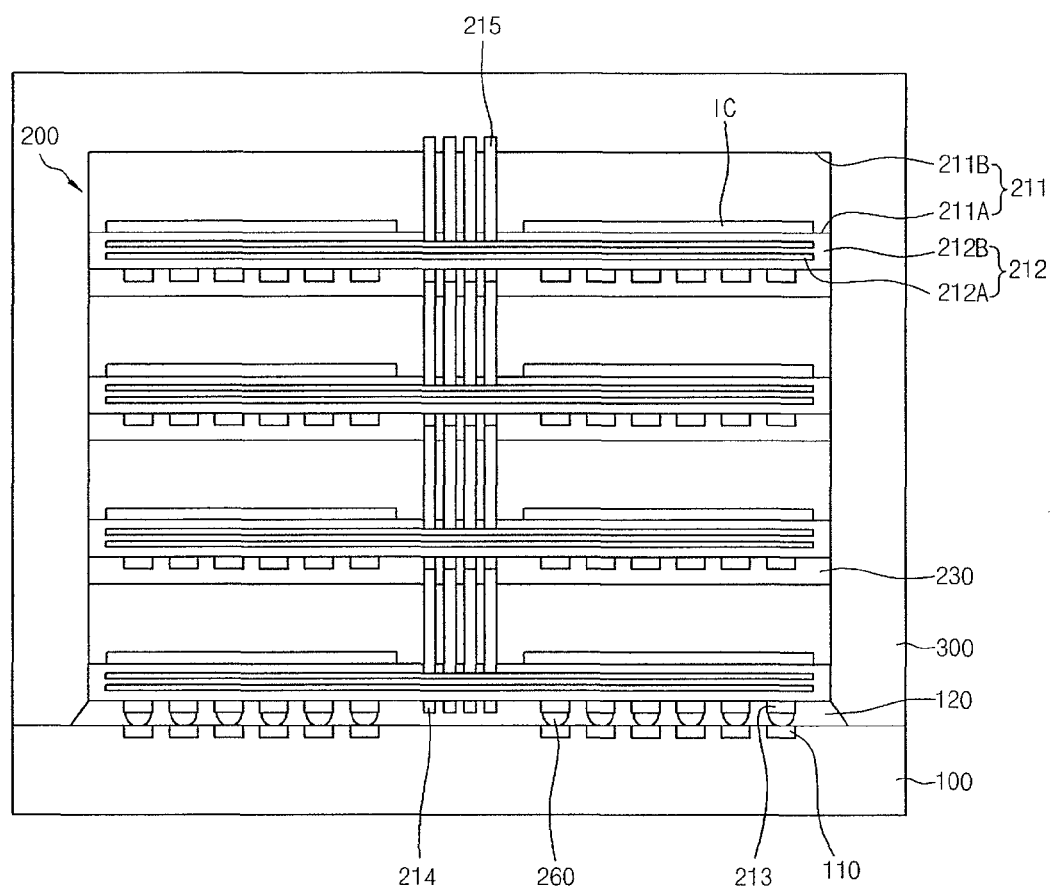
FIG. 5 is a cross-sectional view illustrating a third embodiment type of the stacked semiconductor package having the semiconductor chip in accordance with the first embodiment of the present invention.

FIG. 5 is a cross-sectional view illustrating a third embodiment type of the stacked semiconductor package having the semiconductor chip in accordance with the first embodiment of the present invention.

Referring to FIG. 5, after a plurality of semiconductor chips 200, each of which has first and second input/output pads 213 and 214 and through electrodes 215, are prepared, the through electrodes 215 of the respective semiconductor chips 200 are connected with the second input/output pads 214 of other semiconductor chips 200. In this way, the plurality of, for example, four semiconductor chips 200 are stacked. Adhesive members 230 are formed between the stacked semiconductor chips 200.

The stacked semiconductor chips 200 are mounted onto a substrate 100 in such a manner that the first input/output pads 213 of the lowermost semiconductor chip 200 which is positioned lowermost are electrically connected with connection pads 110 of the substrate 100.

The first input/output pads 213 of the lowermost semiconductor chip 200 and the connection pads 110 of the substrate 100 are electrically connected by means of connection members 260. In the present embodiment, the connection members 260 are formed as bumps. In order to improve the reliability of joints, an underfill member 120 is interposed between the lowermost semiconductor chip 200 and the substrate 100.

A molding member 300 is formed on the upper surface of the substrate 100 including the stacked semiconductor chips 200.

Figure 6:
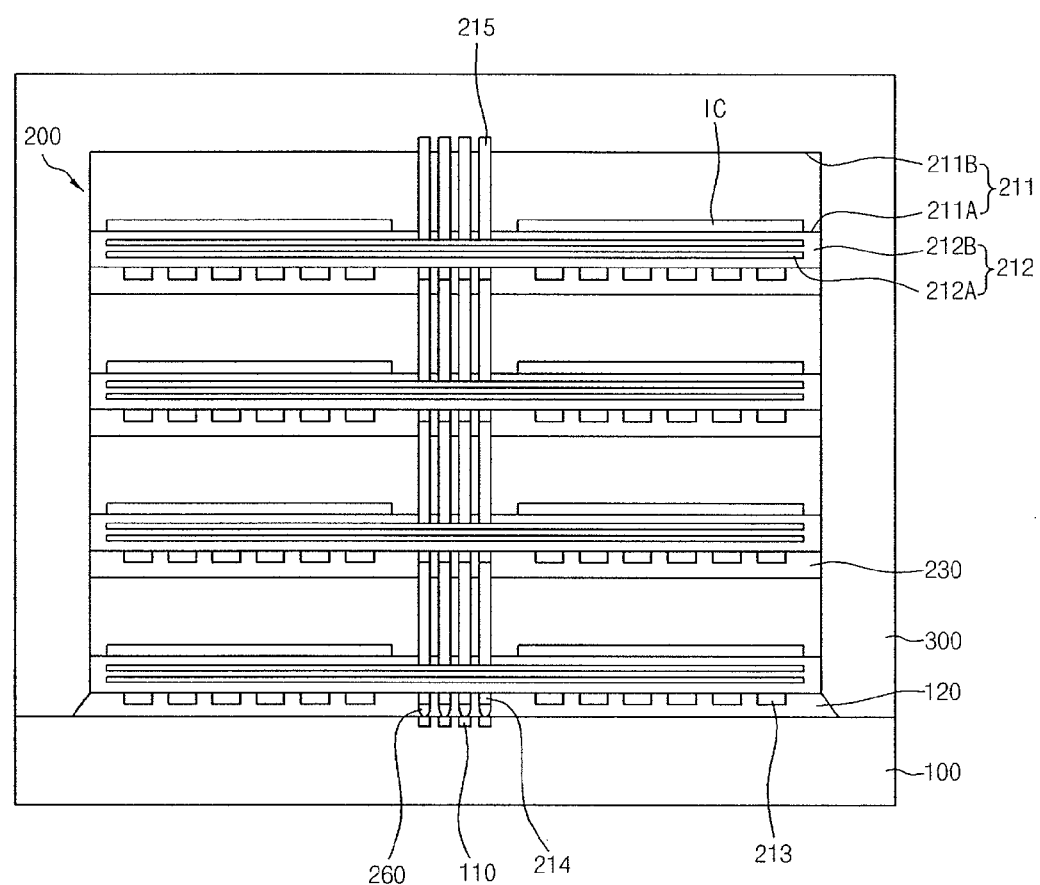
FIG. 6 is a cross-sectional view illustrating a fourth embodiment type of the stacked semiconductor package having the semiconductor chip in accordance with the first embodiment of the present invention.

FIG. 6 is a cross-sectional view illustrating a fourth embodiment type of the stacked semiconductor package having the semiconductor chip in accordance with the first embodiment of the present invention.

Referring to FIG. 6, after a plurality of semiconductor chips 200, each of which has first and second input/output pads 213 and 214 and through electrodes 215, are prepared, the through electrodes 215 of the respective semiconductor chips 200 are connected with the second input/output pads 214 of other semiconductor chips 200. In this way, the plurality of, for example, four semiconductor chips 200 are stacked. Adhesive members 230 are formed between the stacked semiconductor chips 200.

The stacked semiconductor chips 200 are mounted onto a substrate 100 in such a manner that the second input/output pads 214 of the lowermost semiconductor chip 200 which is positioned lowermost are electrically connected with connection pads 110 of the substrate 100.

The second input/output pads 214 of the lowermost semiconductor chip 200 and the connection pads 110 of the substrate 100 are electrically connected by means of connection members 260. In the present embodiment, the connection members 260 are formed as bumps. In order to improve the reliability of joints, an underfill member 120 is interposed between the lowermost semiconductor chip 200 and the substrate 100.

A molding member 300 is formed on the upper surface of the substrate 100 including the stacked semiconductor chips 200.

Figure 7:
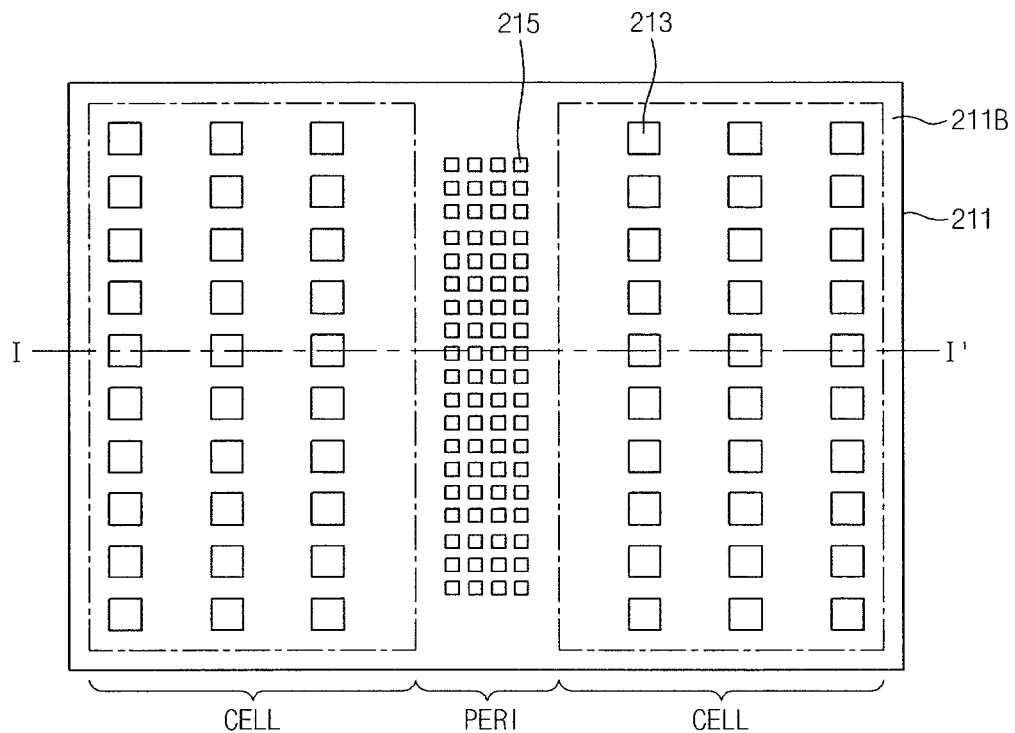
FIG. 7 is a plan view illustrating a semiconductor chip in accordance with a second embodiment of the present invention.
Figure 8:
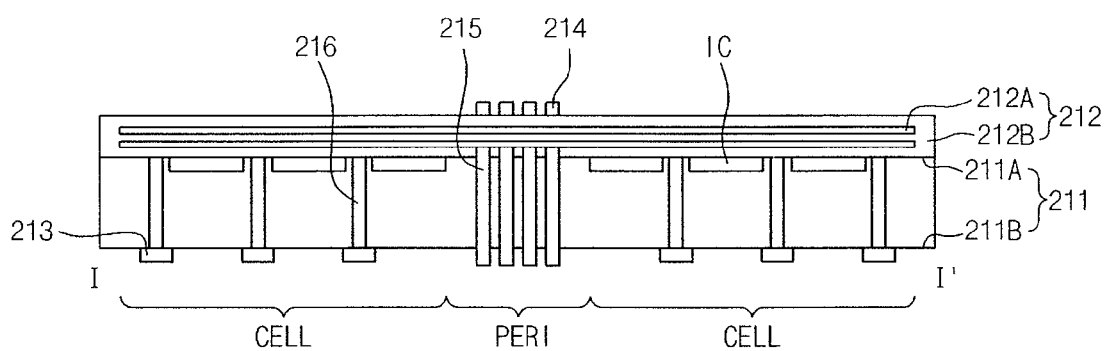
FIG. 8 is a cross-sectional view taken along the line I-I' of FIG. 7.

FIG. 7 is a plan view illustrating a semiconductor chip in accordance with a second embodiment of the present invention, and FIG. 8 is a cross-sectional view taken along the line I-I' of FIG. 7.

Referring to FIGS. 7 and 8, a semiconductor chip 200 in accordance with a second embodiment of the present invention includes a semiconductor substrate 211, circuit patterns 212, and first and second input/output pads 213 and 214. Besides, the semiconductor chip 200 further includes through electrodes 215, and through wiring lines 216.

The semiconductor substrate 211 is divided into a cell region CELL and a peripheral region PERI, and has first surface 211A and the second surface 211B which faces away from the first surface 211A.

Integrated circuits IC which depend upon a chip design are formed in the cell region CELL over the first surface 211A of the semiconductor substrate 211, and input/output circuits are formed in the peripheral region PERI over the first surface 211A of the semiconductor substrate 211.

The circuit patterns 212 are formed over the first surface 211A of the semiconductor substrate 211 and are connected with the cell region CELL and the peripheral region PERI.

The first input/output pads 213 are formed in the cell region CELL over the second surface 211B of the semiconductor substrate 211. The second input/output pads 214 are formed in the peripheral region PERI over the first surface 211A of the semiconductor substrate 211 and are electrically connected with the circuit patterns 212 which are formed over the first surface 211A of the semiconductor substrate 211. In the present embodiment, the first input/output pads 213 have sizes greater than those of the second input/output pads 214.

The through wiring lines 216 pass through the first surface 211A and the second surface 211B of the semiconductor substrate 211, formed in cell region CELL, and electrically connect the circuit patterns 212 which are formed over the first surface 211A of the semiconductor substrate 211 and the first input/output pads 213 which are formed over the second surface 211B of the semiconductor substrate 211. That is to say, at one end of the through wiring lines 216, the through wiring lines 216 are connected with the circuit patterns 212 on the first surface 211A of the semiconductor substrate 211. At the other end of the through wiring lines 216, the through wiring lines 216 are connected with the first input/output pads 213 on the second surface 211B of the semiconductor substrate 211.

The circuit patterns 212 include a plurality of wiring layers 212A which are formed over the first surface 211A of the semiconductor substrate 211 and electrically connect the input/output circuits of the peripheral region PERI and the through wiring lines 216 of the cell region CELL, and an insulation layer 212B which is formed over the first surface 211A of the semiconductor substrate 211 and insulates the wiring layers 212A from one another and the wiring layers 212A and the first and second input/output pads 213 and 214 from one another.

The through electrodes 215 pass through the first surface 211A and the second surface 21113 of the semiconductor substrate 211. The through electrodes 215 are formed in the peripheral region PERI and are electrically connected with the second input/output pads 214.

At one end of the through electrodes 215, the through electrodes 215 are electrically connected with the second input/output pads 214 of the peripheral region PERI, and the other end of the through electrodes 215, the through electrodes 215 project outward away from the second surface 211B of the semiconductor substrate 211.

In the present embodiment, the one ends of the through electrodes 215 are connected with the circuit patterns 212 of the peripheral region PERI over the first surface 211A of the semiconductor substrate 211 and are connected with the second input/output pads 214 through the circuit patterns 212. Unlike this, the one ends of the through electrodes 215 may be directly connected with the second input/output pads 214.

Figure 9:
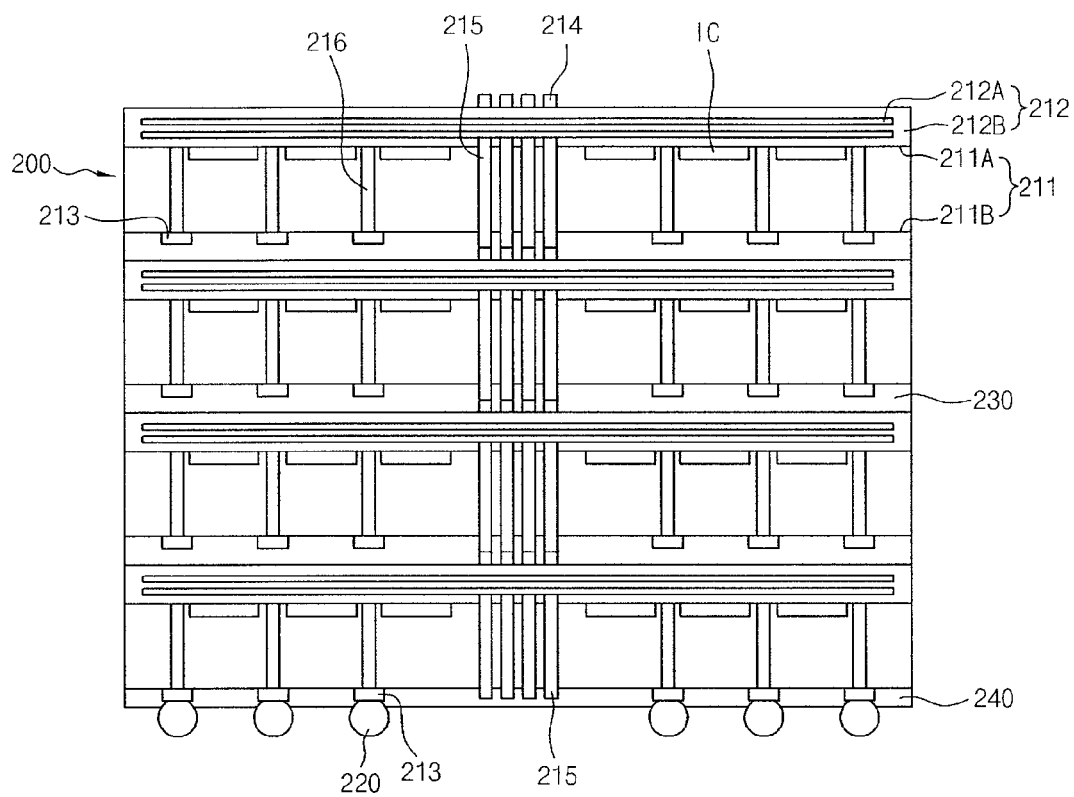
FIG. 9 is a cross-sectional view illustrating a first embodiment type of a stacked semiconductor package having the semiconductor chip in accordance with the second embodiment of the present invention.

FIG. 9 is a cross-sectional view illustrating a first embodiment type of a stacked semiconductor package having the semiconductor chip in accordance with the second embodiment of the present invention.

Referring to FIG. 9, after a plurality of semiconductor chips 200, each of which has first and second input/output pads 213 and 214 and through electrodes 215, are prepared, the through electrodes 215 of the respective semiconductor chips 200 are connected with the second input/output pads 214 of other semiconductor chips 200. In this way, the plurality of, for example, four semiconductor chips 200 are stacked. Adhesive members 230 are formed between the stacked semiconductor chips 200.

An insulation layer 240 is formed on the second surface 211B of the lower most semiconductor chip 200 which is positioned lowermost among the stacked semiconductor chips 200, in such a way as to expose the first input/output pads 213 of the lowermost semiconductor chip 200. External connection terminals 220 are attached to the first input/output pads 213 of the lowermost semiconductor chip 200 which are exposed through the insulation layer 240.

Figure 10:
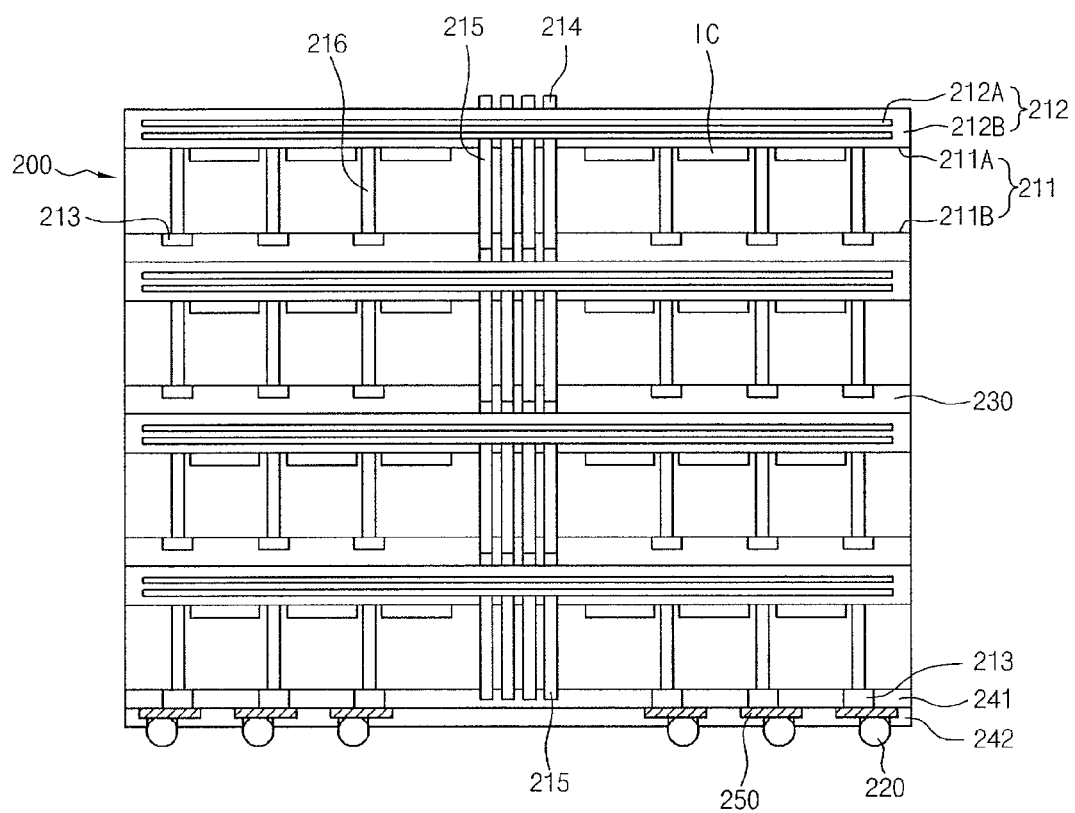
FIG. 10 is a cross-sectional view illustrating a second embodiment type of the stacked semiconductor package having the semiconductor chip in accordance with the second embodiment of the present invention.

FIG. 10 is a cross-sectional view illustrating a second embodiment type of the stacked semiconductor package having the semiconductor chip in accordance with the second embodiment of the present invention.

Referring to FIG. 10, after a plurality of semiconductor chips 200, each of which has first and second input/output pads 213 and 214 and through electrodes 215, are prepared, the through electrodes 215 of the respective semiconductor chips 200 are connected with the second input/output pads 214 of other semiconductor chips 200. In this way, the plurality of, for example, four semiconductor chips 200 are stacked. Adhesive members 230 are formed between the stacked semiconductor chips 200.

A first insulation layer 241 is formed on the second surface 211B of the lower most semiconductor chip 200 which is positioned lowermost among the stacked semiconductor chips 200, in such a way as to expose the first input/output pads 213 of the lowermost semiconductor chip 200. Redistribution lines 250 are formed on the first insulation layer 241 in such a way as to be electrically connected with the first input/output pads 213 of the lowermost semiconductor chip 200, and a second insulation layer 242 is formed on the first insulation layer 241 including the redistribution lines 250 in such a way as to expose portions of the redistribution lines 250. External connection terminals 220 are attached to the redistribution lines 250 which are exposed through the second insulation layer 242.

Figure 11:
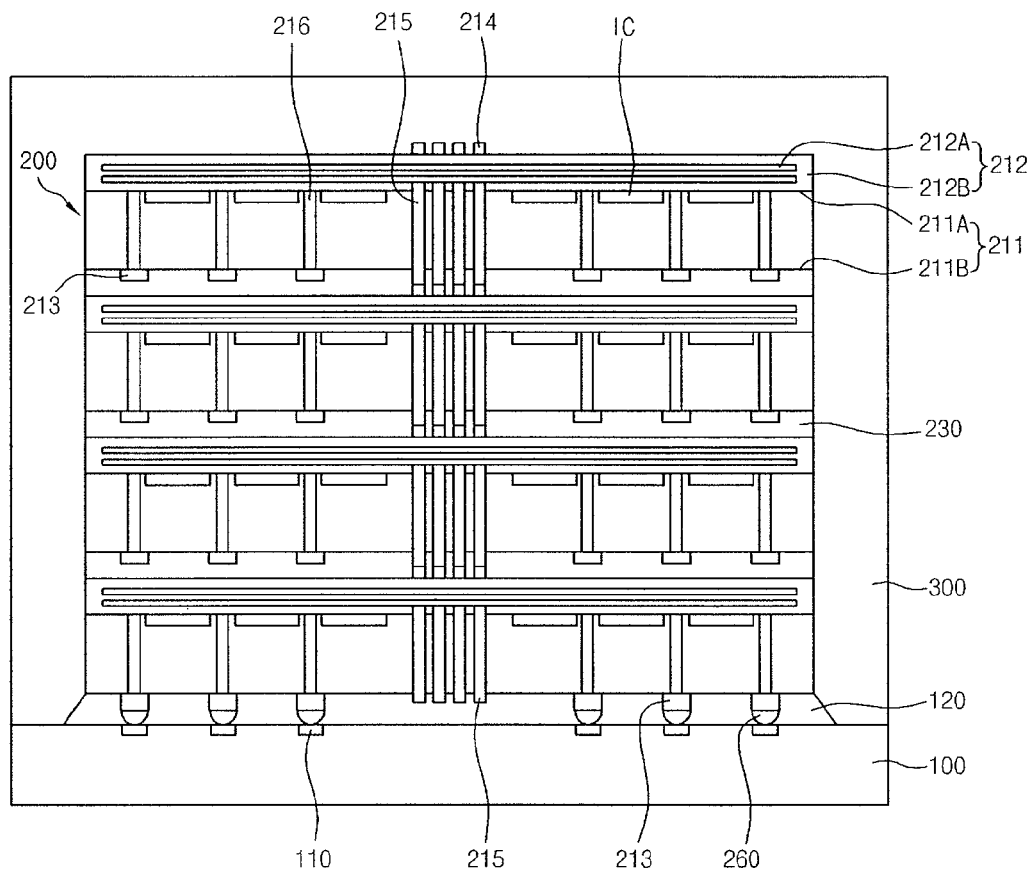
FIG. 11 is a cross-sectional view illustrating a third embodiment type of the stacked semiconductor package having the semiconductor chip in accordance with the second embodiment of the present invention.

FIG. 11 is a cross-sectional view illustrating a third embodiment type of the stacked semiconductor package having the semiconductor chip in accordance with the second embodiment of the present invention.

Referring to FIG. 11, after a plurality of semiconductor chips 200, each of which has first and second input/output pads 213 and 214 and through electrodes 215, are prepared, the through electrodes 215 of the respective semiconductor chips 200 are connected with the second input/output pads 214 of other semiconductor chips 200. In this way, the plurality of, for example, four semiconductor chips 200 are stacked. Adhesive members 230 are formed between the stacked semiconductor chips 200.

The stacked semiconductor chips 200 are mounted onto a substrate 100 in such a manner that the first input/output pads 213 of the lowermost semiconductor chip 200 which is positioned lowermost are electrically connected with connection pads 110 of the substrate 100.

The first input/output pads 213 of the lowermost semiconductor chip 200 and the connection pads 110 of the substrate 100 are electrically connected by means of connection members 260. In the present embodiment, the connection members 260 are formed as bumps. In order to improve the reliability of joints, an underfill member 120 is interposed between the lowermost semiconductor chip 200 and the substrate 100.

A molding member 300 is formed on the upper surface of the substrate 100 including the stacked semiconductor chips 200.

Figure 12:
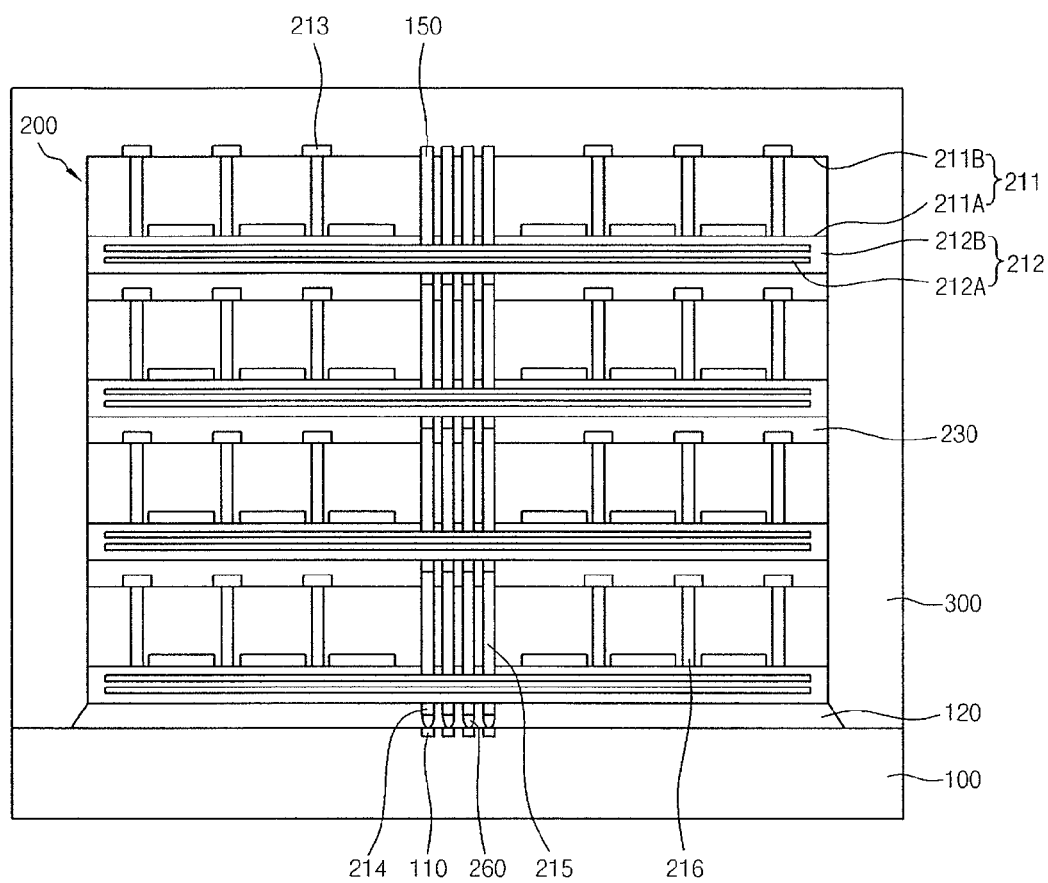
FIG. 12 is a cross-sectional view illustrating a fourth embodiment type of the stacked semiconductor package having the semiconductor chip in accordance with the second embodiment of the present invention.

FIG. 12 is a cross-sectional view illustrating a fourth embodiment type of the stacked semiconductor package having the semiconductor chip in accordance with the second embodiment of the present invention.

Referring to FIG. 12, after a plurality of semiconductor chips 200, each of which has first and second input/output pads 213 and 214 and through electrodes 215, are prepared, the through electrodes 215 of the respective semiconductor chips 200 are connected with the second input/output pads 214 of other semiconductor chips 200. In this way, the plurality of, for example, four semiconductor chips 200 are stacked. Adhesive members 230 are formed between the stacked semiconductor chips 200.

The stacked semiconductor chips 200 are mounted onto a substrate 100 in such a manner that the second input/output pads 214 of the lowermost semiconductor chip 200 which is positioned lowermost are electrically connected with connection pads 110 of the substrate 100.

The second input/output pads 214 of the lowermost semiconductor chip 200 and the connection pads 110 of the substrate 100 are electrically connected by means of connection members 260. In the present embodiment, the connection members 260 are formed as bumps. In order to improve the reliability of joints, an underfill member 120 is interposed between the lowermost semiconductor chip 200 and the substrate 100. A molding member 300 is formed on the upper surface of the substrate 100 including the stacked semiconductor chips 200.

As is apparent from the above description, in the embodiments of the present invention, since input/output pads are formed not only in a peripheral region but also in a cell region in such a way as to be dispersed, the size of the peripheral region can be reduced by the area of input/output pads which are formed in the cell region. Thus, it is possible to provide a semiconductor chip which can overcome limitations in decreasing a size due to the presence of input/output pads and can realize a light, thin, compact and miniature structure, and a stacked semiconductor package having the same.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor chip comprising:
   a semiconductor substrate divided into cell and peripheral regions and having first and second surfaces that oppose each other;
   circuit patterns on the first surface and connected with the cell and peripheral regions;
   first input/output pads formed in the cell region over the second surface of the semiconductor substrate and connected to the circuit patterns;
   through wiring lines in the cell region which pass through the first and second surfaces, and which electrically connect the circuit patterns to the first input/output pads; and
   second input/output pads formed in the peripheral region over the first surface of the semiconductor substrate and connected with the circuit patterns.

2. The semiconductor chip according to claim 1, wherein the first input/output pads are sized larger than the second input/output pads.

3. The semiconductor chip according to claim 1, further comprising:
   through electrodes passing through the first and second surfaces of the semiconductor substrate, the through electrodes formed in the peripheral region and electrically connected to the second input/output pads.

4. A stacked semiconductor package comprising:
   a plurality of semiconductor chips stacked upon one another, and each semiconductor chip including:
      a semiconductor substrate divided into cell and peripheral regions and having first and second surfaces which oppose each other;
      circuit patterns on the first surface and connected with the cell and peripheral regions;
      first input/output pads formed in the cell region over the second surface of the semiconductor substrate connected to the circuit patterns;
      second input/output pads formed in the peripheral region over the first surface of the semiconductor substrate and connected to the circuit patterns;
      through wiring lines in the cell region which pass through the first and second surfaces and which electrically connect the circuit patterns to the first input/output pads; and
      through electrodes, that pass through the first and second surfaces, in the peripheral region, and which are electrically connected to the second input/output pads,
   wherein the plurality of semiconductor chips are stacked upon each other such that the second input/output pads of upwardly positioned semiconductor chips and the through electrodes of downwardly positioned semiconductor chips are electrically connected together.

5. The stacked semiconductor package according to claim 4, wherein the first input/output pads are sized larger than the second input/output pads.

6. The stacked semiconductor package according to claim 4, further comprising:
   an insulation layer formed on the first surface of a lowermost semiconductor chip so that the first input/output pads of the lowermost semiconductor chip are not covered by the insulation layer.

7. The stacked semiconductor package according to claim 6, further comprising:
   external connection terminals attached to the first input/output pads of the lowermost semiconductor chip.

8. The stacked semiconductor package according to claim 4, further comprising:
   a first insulation layer formed on the first surface of a lowermost semiconductor chip so that the first input/output pads of the lowermost semiconductor chip are not covered by the insulation layer;
   redistribution lines on the first insulation layer and electrically connected to the first input/output pads of the lowermost semiconductor chip; and
   a second insulation layer formed on the first insulation layer and partially formed on the redistribution lines such that portions of the redistribution lines are not covered by the second insulation layer.

9. The stacked semiconductor package according to claim 8, further comprising:
   external connection terminals on the portions of the redistribution lines which are are not covered by the second insulation layer.

10. The stacked semiconductor package according to claim 4, further comprising:
   a substrate having the plurality of stacked semiconductor chips mounted thereon and electrically connected to the second input/output pads of the lowermost semiconductor chip among the plurality of stacked semiconductor chips.

11. The stacked semiconductor package according to claim 4, further comprising:
   a substrate having the plurality of stacked semiconductor chips mounted thereon and electrically connected to the second input/output pads of the lowermost semiconductor chip among the plurality of stacked semiconductor chips.

* * * * *